United States Patent
Lin et al.

(10) Patent No.: US 10,039,185 B2
(45) Date of Patent: Jul. 31, 2018

(54) MANUFACTURING METHOD OF LANDLESS MULTILAYER CIRCUIT BOARD

(71) Applicant: Kinsus Interconnect Technology Corp., Taoyuan (TW)

(72) Inventors: Ting-Hao Lin, Taoyuan (TW); Chiao-Cheng Chang, Taoyuan (TW); Yi-Nong Lin, Taoyuan (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 85 days.

(21) Appl. No.: 15/130,724

(22) Filed: Apr. 15, 2016

(65) Prior Publication Data

US 2017/0303397 A1    Oct. 19, 2017

(51) Int. Cl.
| | |
|---|---|
| *H01K 3/10* | (2006.01) |
| *H05K 1/11* | (2006.01) |
| *H05K 3/18* | (2006.01) |
| *H05K 3/42* | (2006.01) |
| *H05K 3/00* | (2006.01) |
| *H05K 3/46* | (2006.01) |

(52) U.S. Cl.
CPC ........... *H05K 1/115* (2013.01); *H05K 3/0047* (2013.01); *H05K 3/0079* (2013.01); *H05K 3/0094* (2013.01); *H05K 3/18* (2013.01); *H05K 3/429* (2013.01); *H05K 3/4644* (2013.01); *Y10T 29/49165* (2015.01)

(58) Field of Classification Search
CPC .......... H01L 23/49827; H01L 21/4857; H05K 2201/09536; H05K 3/4644; H05K 3/4623; H05K 2201/09563; H05K 3/0079; H05K 3/0094; H05K 3/4038; H05K 3/429; Y10T 29/49165; Y10T 29/49155; Y10T 29/49126
USPC .......................... 29/852, 825, 829, 831, 846
See application file for complete search history.

(56) References Cited

U.S. PATENT DOCUMENTS

| | | | |
|---|---|---|---|
| 7,178,233 B2 * | 2/2007 | Nakamura | H01L 21/4857 257/E23.062 |
| 7,882,627 B2 * | 2/2011 | Koyama | H05K 3/4614 174/260 |

* cited by examiner

*Primary Examiner* — Thiem Phan
(74) *Attorney, Agent, or Firm* — Juan Carlos A. Marquez; Marquez IP Law Office, PLLC

(57) ABSTRACT

Provided is a landless multilayer circuit board and a manufacturing method thereof. The manufacturing method includes steps of forming a first circuit on a first substrate, patterning a photoresist layer to form at least one via between the first circuit and a second circuit, forming at least one connecting pillar in the at least one via, removing the photoresist layer, forming a second substrate to cover the at least one connect pillar, and forming the second circuit on the second substrate. The second circuit is connected to the first circuit through the at least one connecting pillar. When the second circuit is formed, the at least one via does not need to be filled, thereby making the second circuit flat.

10 Claims, 13 Drawing Sheets

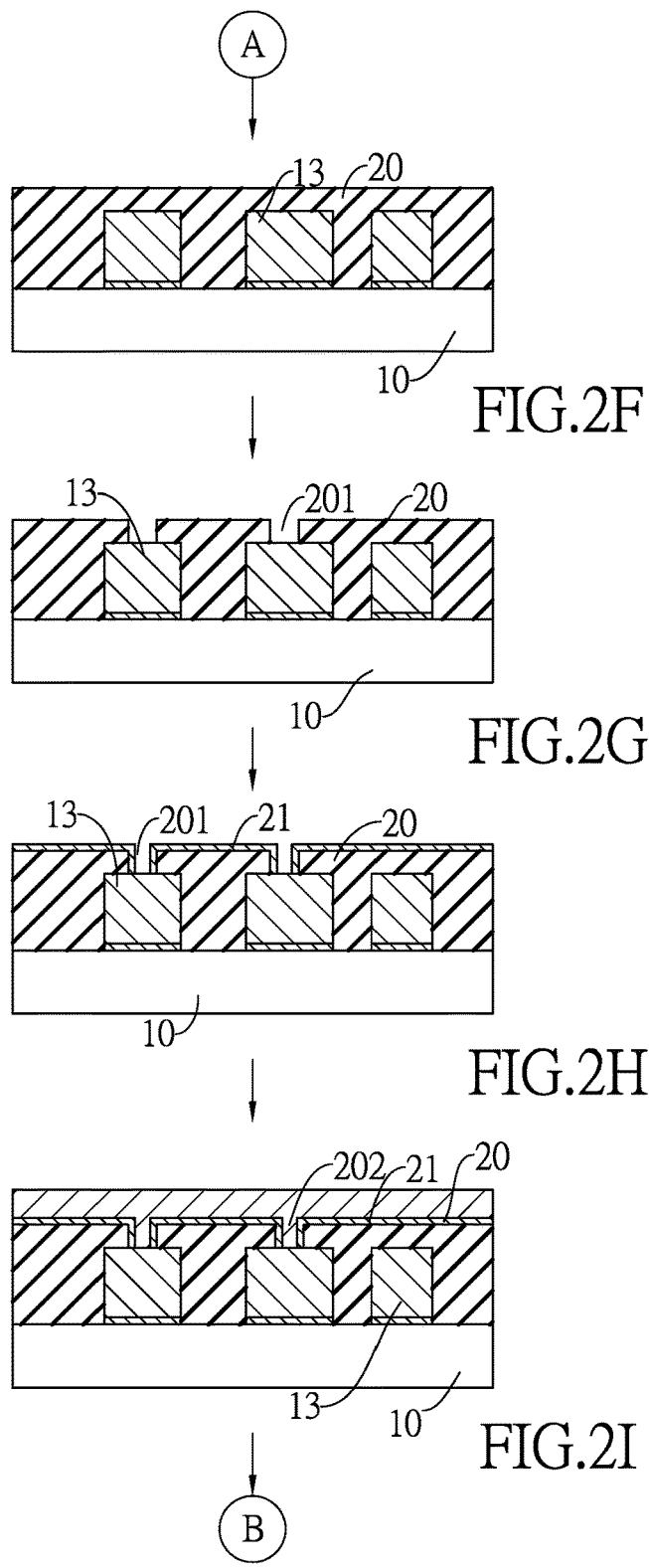

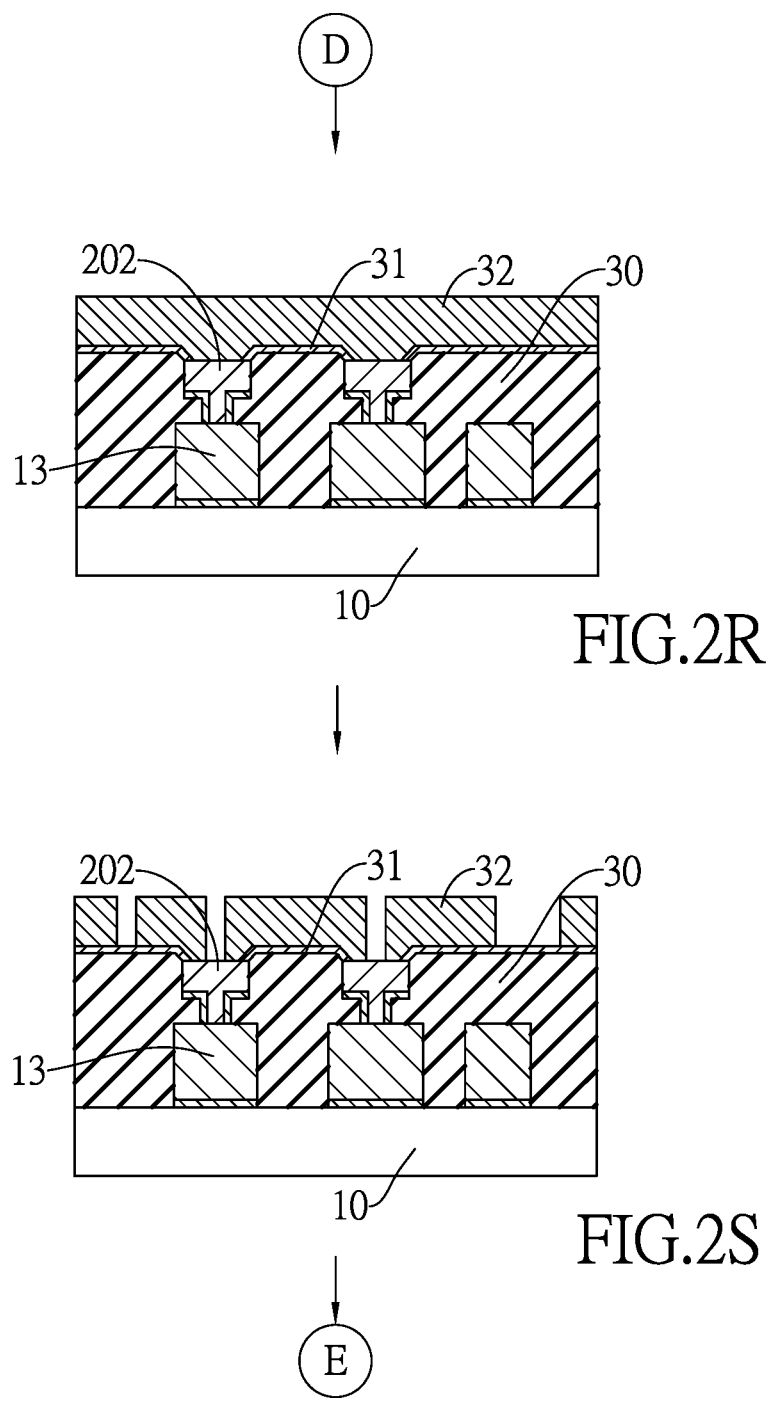

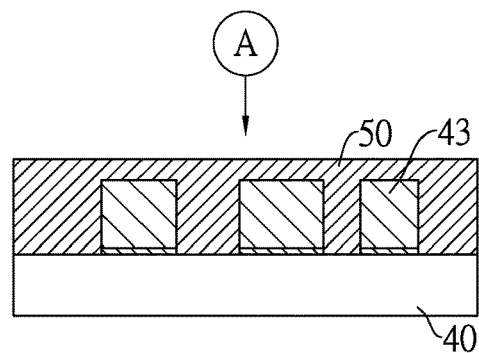
FIG.4F
PRIOR ART
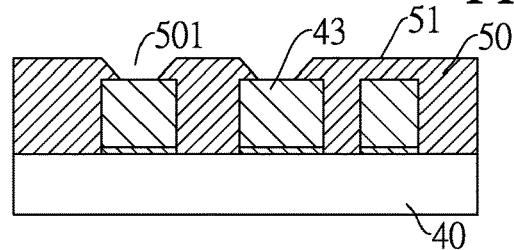
FIG.4G
PRIOR ART
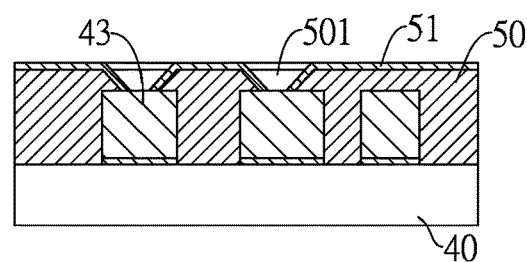
FIG.4H
PRIOR ART
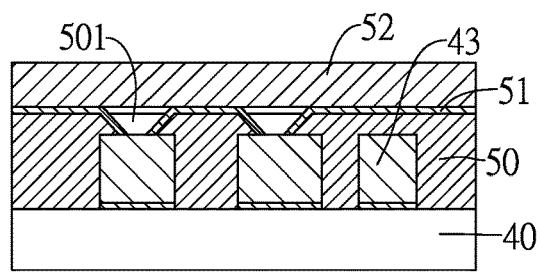
FIG.4I
PRIOR ART
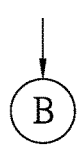

MANUFACTURING METHOD OF LANDLESS MULTILAYER CIRCUIT BOARD

BACKGROUND OF THE INVENTION

1. Field of the Invention

The present invention relates to a multilayer circuit board, and particularly to a landless multilayer circuit board and a manufacturing method thereof.

2. Description of the Related Art

A conventional multilayer circuit board includes multiple circuit layers. Each one of the circuit layers may have a circuit. The multiple circuit layers are separately manufactured in a manufacturing process of the conventional multilayer circuit board. At least one via is formed between two adjacent circuit layers of the multilayer circuit board by laser. Therefore, two circuits on the two adjacent circuit layers may be electrically connected through the at least one via.

With reference to FIGS. 4A-4M, a manufacturing method of the conventional multilayer circuit board comprises the following steps.

With reference to FIG. 4A, the first step is to provide a first substrate 40; wherein a first plating layer 41 is mounted on a surface of the first substrate 40 and a first photoresist layer 42 is mounted on the first plating layer 41. Therefore, the first plating layer 41 is mounted between the first substrate 40 and the first photoresist layer 42.

With reference to FIG. 4B, the second step is to pattern the first photoresist layer 42 to form a groove of a first circuit pattern in the first photoresist layer 42; wherein the first plating layer 41 is exposed in the groove of the first circuit pattern.

With reference to FIG. 4C, the third step is to form a first circuit 43 in the groove of the first circuit pattern on the first plating layer 41 by plating the first plating layer 41.

With reference to FIG. 4D, the fourth step is to remove the first photoresist layer 42, and to maintain the first circuit 43. A portion of the first plating layer 41 is uncovered by the first circuit 43.

With reference to FIG. 4E, the fifth step is to remove the portion of the first plating layer 41 that is uncovered by the first circuit 43, and to maintain the first circuit 43 and a portion of the first plating layer 41 that is covered by the first circuit 43. A portion of the first substrate 40 is uncovered by the first circuit 43 and the first plating layer 41.

With reference to FIG. 4F, the sixth step is to form a second substrate 50 on the first substrate 40 to cover the first circuit 43 and a portion of the first plating layer 41 that is covered by the first circuit 43.

With reference to FIG. 4G, the seventh step is to drill the second substrate 50 by laser to form at least one via 501 to expose at least one portion of the first circuit 43.

With reference to FIG. 4H, the eighth step is to form a second plating layer 51 on a surface of the second substrate 50 and in the at least one via 501. The second plating layer 51 is electrically connected to the first circuit 43.

With reference to FIG. 4I, the ninth step is to form a second photoresist layer 52 on a surface of the second plating layer 51.

With reference to FIG. 4J, the tenth step is to pattern the second photoresist layer 52 to form a groove of a second circuit pattern in the second photoresist layer 52; wherein the second plating layer 51 is exposed in the groove of the second circuit pattern.

With reference to FIG. 4K, the eleventh step is to form a second circuit 53 in the groove of the second circuit pattern and the at least one via 501 by plating the second plating layer 51. The second circuit 53 is electrically connected to the second plating layer 51 and the first circuit 43 through the plated second plating layer 51.

With reference to FIG. 4L, the twelfth step is to remove the second photoresist layer 52, and to maintain the second circuit 53. A portion of the second plating layer 51 is uncovered by the second circuit 53

With reference to FIG. 4M, the thirteenth step is to remove the portion of the second plating layer 51 that is uncovered by the second circuit 53. When the portion of the second plating layer 51 that is uncovered by the second circuit 53 is removed, the conventional multilayer circuit board is completed.

When the second photoresist layer 52 is patterned, a displacement may be formed between the groove of the second circuit pattern and the at least one via 501. Therefore, the groove of the second circuit pattern may not precisely match and align with the at least one via 501. As shown in FIGS. 4J and 4K, when the second circuit 53 is formed by plating the second plating layer 51, the second circuit 53 is right above the at least one via 501, and the second circuit 53 is electronically connected to the first circuit 43 through the at least one via 501 plated by the second plating layer 51. Therefore, at least one top of the at least one via 501 does not form a land to electronically connect to the first circuit 43. Further, a line width of the second circuit 53 is smaller than an inner diameter of the at least one via 501. Therefore, when the displacement is formed between the second photoresist layer 52 and the at least one via 501, the groove of the second circuit pattern is not precisely aligned with the at least one via 501, and the second circuit pattern may partially shelter the at least one via 501. As shown in FIG. 5, then, the at least one via 501 may not be fully filled during plating of the second plating layer 51. An edge of the at least one via 501 may form a gap, and the at least one via 501 may not be fully filled.

Besides, since the second circuit 53 is connected to the first circuit 43 through the at least one via 501 plated by the second plating layer 51 and a top surface of the first circuit 43 and a top surface of the second circuit 53 are not at a same plane, a height difference is formed between the top surfaces of the first circuit 43 and the top surfaces of the second circuit 53. When the second circuit 53 is formed by plating the second plating layer 51, the second plating layer 51 is plated for a specific time. The second plating layer 51 in the at least one via 501 needs to be filled at first, but the second plating layer 51 on the surface of the second substrate 50 is directly plated. Therefore, since the second plating layer 51 is plated for the specific time, a plating thickness of the second plating layer 51 in the at least one via 501 is equal to a plating thickness of the second plating layer 51 on the surface of the second substrate 50, and a surface of the second circuit 53 may not be flat. As shown in FIG. 4K, since the at least one via 501 needs to be fully filled when the second circuit 53 is formed by plating the second plating layer 51, a top of the second circuit 53 that corresponds to the at least one via 501 may be lower than a top of the second circuit 53 that does not correspond to the at least one via 501.

With reference to FIG. 6, when a circuit board 60 is welded at the second circuit 53, welded pins 61 of the circuit board 60 have a same length, pinheads of the welded pins 61 are at a same plane, and the top surface of the second circuit 53 may contact the welded pins 61 of the circuit board 60. However, the top surface of the second circuit 53 may not contact the welded pins 61 of the circuit board 60, and the circuit board 60 may not be well welded on the second circuit 53.

Since the at least one via 501 of the multilayer circuit board may not be fully filled by the second circuit 53 and the circuit board 60 may not be well welded at the second circuit 53, the manufacturing method of the multilayer circuit board should be improved.

SUMMARY OF THE INVENTION

An objective of the present invention is to provide a landless multilayer circuit board and a manufacturing method thereof. The manufacturing method of the landless multilayer circuit board fully fills at least one via to avoid that the at least one via is not fully filled and a gap is formed on an edge of the at least one via. A surface of a second circuit is flat to avoid that a circuit board at the second circuit may not be well welded on the second circuit.

To achieve the foregoing objective, the manufacturing method of the landless multilayer circuit board comprises the following steps.

The first step is to provide a first substrate; wherein a first plating layer is mounted on the first substrate and a first photoresist layer is mounted on the first plating layer.

The second step is to pattern the first photoresist layer to form a groove of a first circuit pattern, wherein the first plating layer is exposed in the groove of the first circuit pattern.

The third step is to form a first circuit in the grooves of the first circuit pattern by plating the first plating layer to fill the groove of the first circuit pattern.

The fourth step is to remove the first photoresist layer to expose the first plating layer, and to maintain the first circuit. A portion of the first plating layer is uncovered by the first circuit.

The fifth step is to remove the portion of the first plating layer that is uncovered by the first circuit, and to maintain the first circuit and a portion of the first plating layer that is covered by the first circuit. A portion of the first substrate is uncovered by the first circuit and the first plating layer.

The sixth step is to form a second photoresist layer on the first substrate to cover the first circuit and the portion of the first plating layer that is covered by the first circuit.

The seventh step is to pattern the second photoresist layer to form at least one via to expose a top surface of the first circuit.

The eighth step is to form a second plating layer on a surface of the second photoresist layer and in the at least one via. The second plating layer is electrically connected to the first circuit.

The ninth step is to form at least one connecting pillar that fills the at least one via by plating the second plating layer in the at least one via.

The tenth step is to form a third photoresist layer on the at least one connecting pillar and the plated second plating layer.

The eleventh step is to pattern the third photoresist layer to cover at least one top of the at least one connecting pillar to expose the plated second plating layer.

The twelfth step is to remove a portion of the second plating layer that is uncovered by the third photoresist layer.

The thirteenth step is to remove the third photoresist layer.

The fourteenth step is to remove the second photoresist layer.

The fifteenth step is to form a second substrate on the first substrate to cover the first circuit and the at least one connecting pillar.

The sixteenth step is to drill the second substrate by laser to expose the at least one top of at least one connecting pillar out of a surface of the second substrate.

The seventeenth step is to form a third plating layer on the surface of the second substrate. The third plating layer is electronically connected to the at least one connecting pillar.

The eighteenth step is to form a fourth photoresist layer on a surface of the third plating layer.

The nineteenth step is to pattern the fourth photoresist layer to form a groove of a second circuit pattern in the second photoresist layer, wherein the third plating layer is exposed in the groove of the second circuit pattern.

The twentieth step is to form a second circuit in the groove of the second circuit pattern by plating the third plating layer.

The twenty-first step is to remove the fourth photoresist layer to expose the third plating layer, and to maintain the second circuit. A portion of the third plating layer is uncovered by the second circuit.

The twenty-second step is to remove a portion of the third plating layer that is uncovered by the second circuit, and to maintain the second circuit and a portion of the third plating layer that is covered by the second circuit. A portion of the second substrate is uncovered by the second circuit and the third plating layer.

In the present invention, the second photoresist layer is patterned to form the at least one via, and the at least one connecting pillar is formed by plating the second plating layer to fill the at least one via before the second substrate is formed. Therefore, when the second circuit is formed, the fourth photoresist layer may not need to be patterned to match the at least one via, and the second circuit may be directly electronically connected to the at least one connecting pillar to connect to the first circuit.

The second substrate is formed after the at least one connecting pillar is formed, and the at least one top of the at least one connecting pillar is exposed out of the surface of the second substrate. When the second circuit is formed by plating the third plating layer, the at least one via does not need to be filled, and the second circuit is formed on the at least one top of the at least one connecting pillar and the surface of the second substrate. Then, a top surface of the second circuit may be flatly formed. Therefore, when a circuit board is welded at the second circuit, the circuit board may be well welded at the second circuit, and the circuit board may be firmly welded at the second circuit.

Further, to achieve the foregoing objective, the landless multilayer circuit board comprises a first substrate, a first circuit, at least one connecting pillar, a second substrate, and a second circuit.

The first circuit is mounted on a surface of the first substrate. The at least one connecting pillar is connected to the first circuit. The second substrate is mounted on the surface of the first substrate, and covers the first circuit and the at least one connecting pillar. The at least one connecting pillar is exposed out of a surface of the second substrate, and an area of a portion of the at least one connecting pillar that is exposed out of the surface of the second substrate is greater than an area of a portion of the at least one connecting pillar that is connected to the first circuit. The second circuit is mounted on the surface of the second substrate, and is connected to the portion of the at least one connecting pillar that is exposed out of the surface of the second substrate.

The at least one connecting pillar is exposed out of the surface of the second substrate, and the portion of the at least one connecting pillar that is exposed out of the surface of the second substrate is at a same plane with the surface of the second substrate. Therefore, the second circuit may be flatly formed. When a circuit board is welded at the second circuit, the circuit board may be firmly welded at the second circuit.

Further, since the area of the portion of the at least one connecting pillar that is exposed out of the surface of the second substrate is greater than the area of the portion of the at least one connecting pillar that is connected to the first circuit, the second circuit may be firmly connected to the at least one connecting pillar, and be firmly connected to the first circuit through the firmly connected at least one connecting pillar. A yield rate of the landless multilayer circuit board may be raised.

Other objectives, advantages and novel features of the invention will become more apparent from the following detailed description when taken in conjunction with the accompanying drawings.

BRIEF DESCRIPTION OF THE DRAWINGS

FIGS. 4A-4M are schematic views of manufacturing a conventional multilayer circuit board;

DETAILED DESCRIPTION OF THE INVENTION

Figure 1:
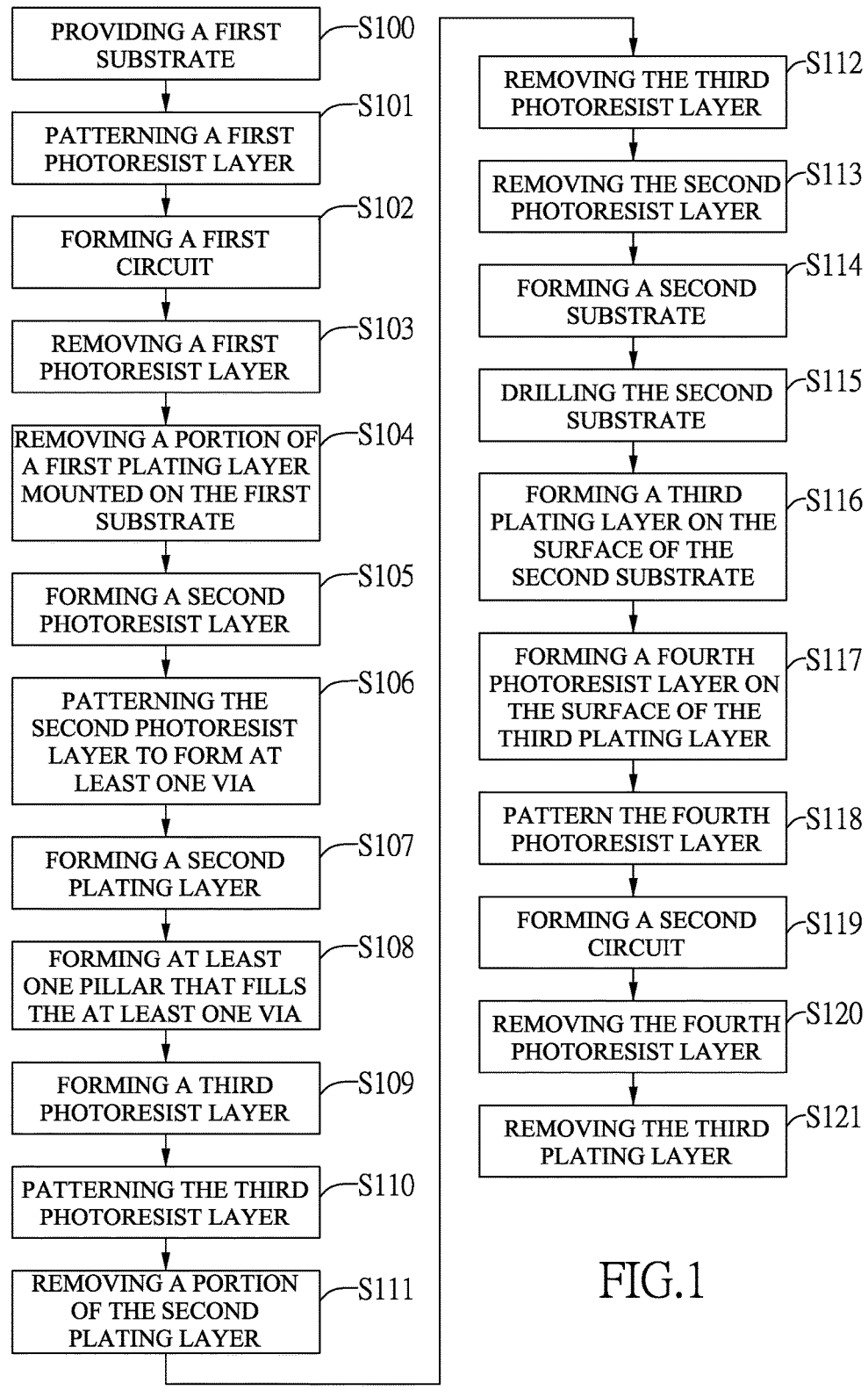
FIG. 1 is a flowchart of an embodiment of a manufacturing method of a landless multilayer circuit board.

With reference to FIG. 1, the present invention is a landless multilayer circuit board and a manufacturing method thereof. The manufacturing method of the landless multilayer circuit board comprises the following steps:

providing a first substrate (S100);
patterning a first photoresist layer (S101);
forming a first circuit (S102);
removing the first photoresist layer (S103);
removing a portion of a first plating layer mounted on the first substrate (S104);
forming a second photoresist layer (S105);
patterning the second photoresist layer to form at least one via (S106);
forming a second plating layer (S107);
forming at least one connecting pillar that fills the at least one via (S108);
forming a third photoresist layer (S109);
patterning the third photoresist layer (S110);
removing a portion of the second plating layer (S111);
removing the third photoresist layer (S112);
removing the second photoresist layer (S113);
forming a second substrate (S114);
drilling the second substrate (S115);

forming a third plating layer on the surface of the second substrate (S116);
forming a fourth photoresist layer on the surface of the third plating layer (S117);
patterning the fourth photoresist layer (S118);
forming a second circuit (S119);
removing the fourth photoresist layer (S120);
removing the third plating layer (S121).

Figure 2A:
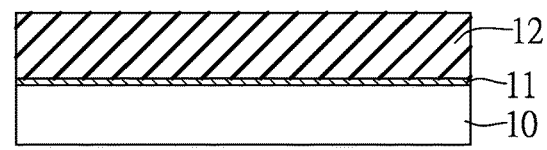
FIGS. 2A-2V are schematic views of the manufacturing method of a landless multilayer circuit board.
Figure 2B:
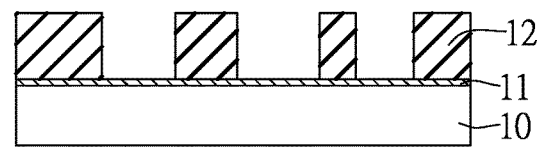
Figure 2C:
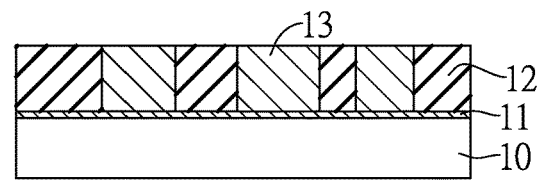
Figure 2D:
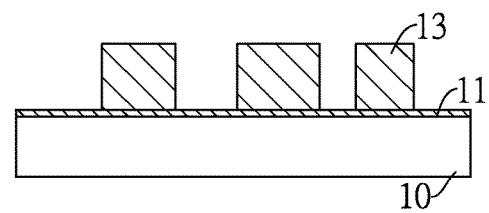
Figure 2E:
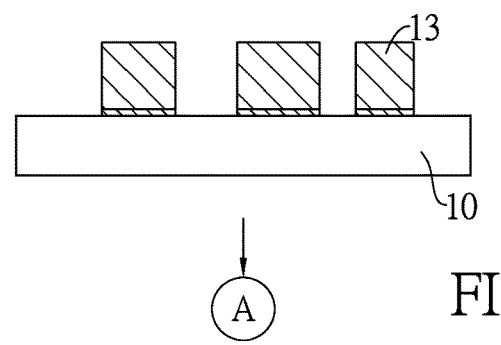
Figure 2J:
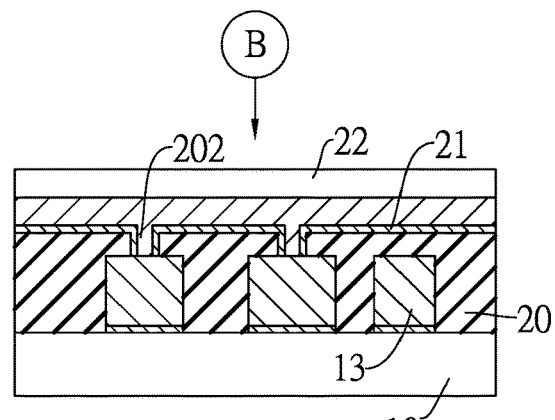
Figure 2K:
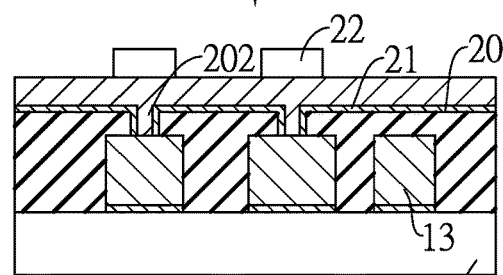
Figure 2L:
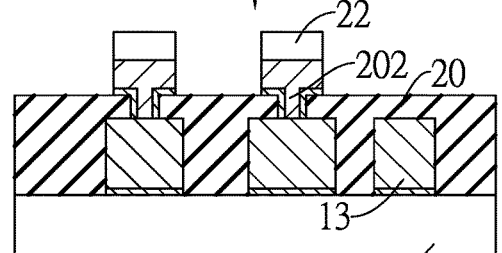
Figure 2M:
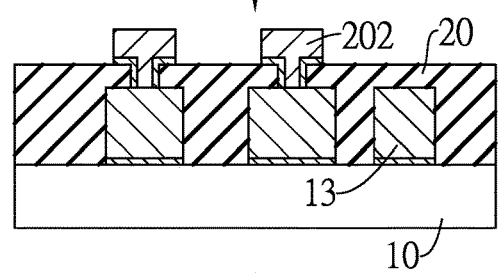
Figures 2N, 2O, 2P, 2Q:
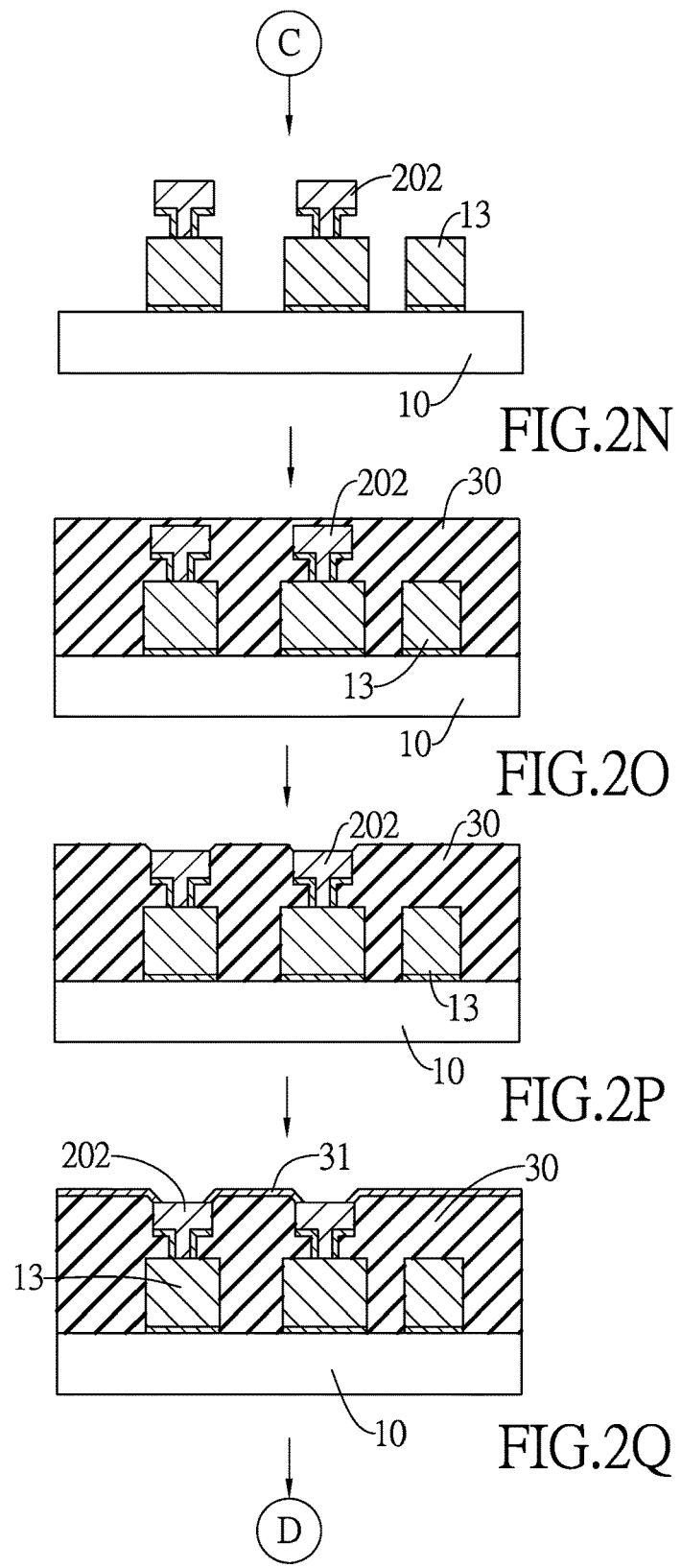
Figures 2T, 2U, 2V:
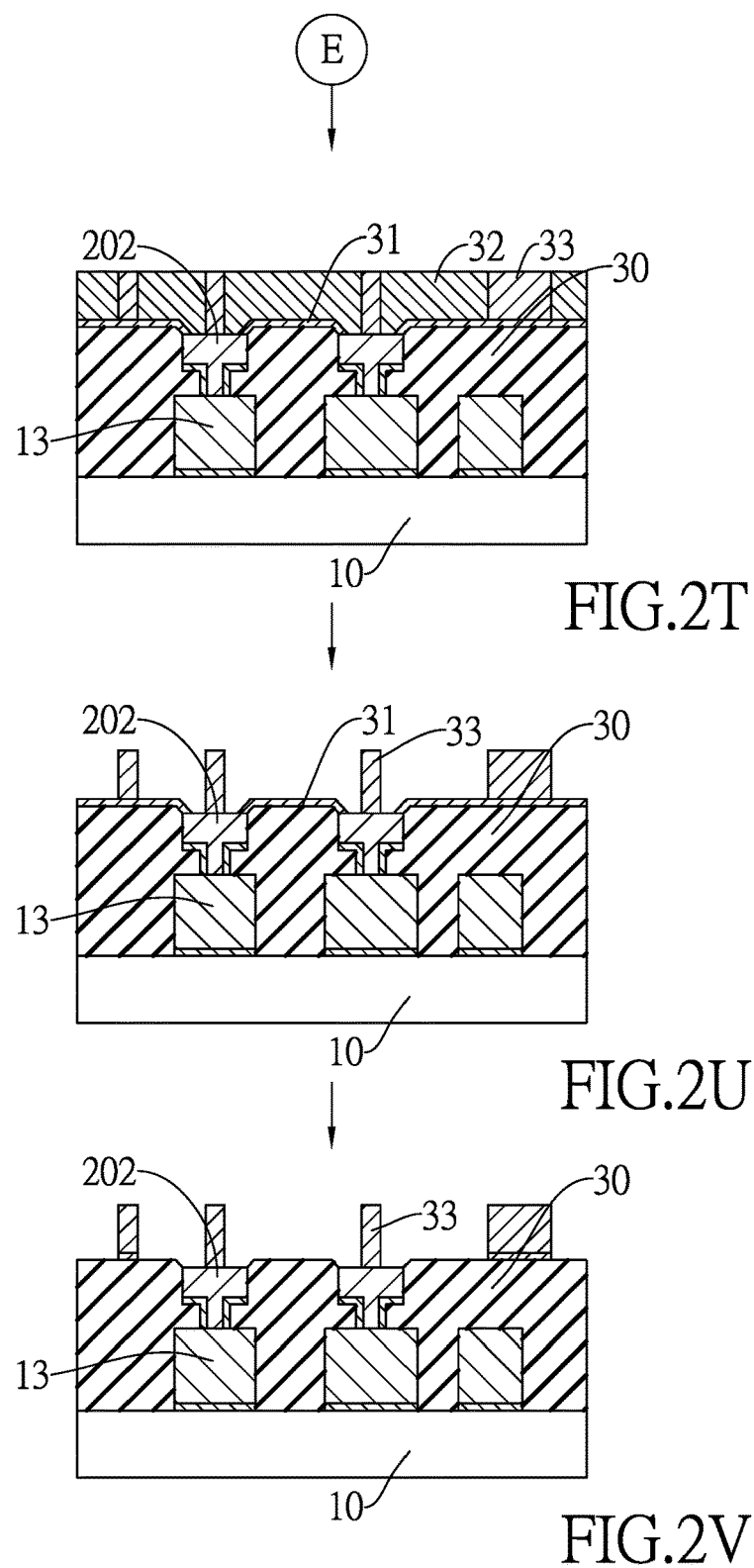

Further with reference to FIGS. 1 and 2A-2V, in FIG. 2A, as recited in the step (S100), a first substrate 10 is provided, and a first plating layer 11 is mounted on a surface of the first substrate 10, and a first photoresist layer 12 is mounted on the first plating layer 11.

In FIG. 2B, as recited in the step (S101), the first photoresist layer 12 is patterned to form a groove of a first circuit pattern in the first photoresist layer 12. The first plating layer 11 is exposed in the groove of the first circuit pattern.

In FIG. 2C, as recited in the step (S102), a first circuit 13 is formed in the groove of the first circuit pattern by plating the first plating layer 11 to fill the groove of the first circuit pattern.

In FIG. 2D, as recited in the step (S103), the first photoresist layer 12 is removed to expose to first plating layer 11, and to maintain the first circuit 13. A portion of the first plating layer 11 is uncovered by the first circuit 13.

In FIG. 2E, as recited in the step (S104), a portion of the first plating layer 11 that is uncovered by the first circuit 13 is removed, and the first circuit 13 and a portion of the first plating layer 11 that is covered by the first circuit 13 are maintained. A portion of the first substrate 10 is uncovered by the first circuit 13 and the first plating layer 11.

In FIG. 2F, as recited in the step (S105), a second photoresist layer 20 is formed on the first substrate 10 to cover the first circuit 13 and the portion of the first plating layer 11 that is covered by the first circuit 13.

In FIG. 2G, as recited in the step (S106), the second photoresist layer 20 is patterned to form at least one via 201 to expose a top surface of the first circuit 13.

In FIG. 2H, as recited in the step (S107), a second plating layer 21 is formed on a surface of the second photoresist layer 20.

In FIG. 2I, as recited in the step (S108), at least one connecting pillar 202 that fills the at least one via 201 is formed by plating a portion of the first circuit 13 connected by the at least one via 201 and the second plating layer 21.

In FIG. 2J, as recited in the step (S109), a third photoresist layer 22 is formed on the at least one connecting pillar 202 and the plated second plating layer 21.

In FIG. 2K, as recited in the step (S110), the third photoresist layer 22 is patterned to cover at least one top of the at least one connecting pillar 202 and to expose the plated second plating layer 21.

In FIG. 2L, as recited in the step (S111), the exposed and plated second plating layer 21 is removed.

In FIG. 2M, as recited in the step (S112), the third photoresist layer 22 is removed.

In FIG. 2N, as recited in the step (S113), the second photoresist layer 20 is removed.

In FIG. 2O, as recited in the step (S114), a second substrate 30 is formed on the first substrate 10 to cover the first circuit 13 and the at least one connecting pillar 202.

In FIG. 2P, as recited in the step (S115), the second substrate 30 is drilled by laser to expose the top of the at least one connecting pillar 202.

In FIG. 2Q, as recited in the step (S116), a third plating layer 31 is formed on the surface of the second substrate 30.

The third plating layer 31 is electronically connected to the at least one connecting pillar 202.

In FIG. 2R, as recited in the step (S117), a fourth photoresist layer 32 is formed on the surface of the third plating layer 31.

In FIG. 2S, as recited in the step (S118), the fourth photoresist layer 32 is patterned to form a groove of a second circuit pattern. The top of the at least one connecting pillar 202 and at least one portion of a top surface of the third plating layer 31 are exposed in the groove of the second circuit pattern.

In FIG. 2T, as recited in the step (S119), a second circuit 33 in the groove of the second circuit pattern is formed by plating the third plating layer 31. The second circuit 33 is electronically connected to the at least one connecting pillar 202 and the third plating layer 31.

In FIG. 2U, as recited in the step (S120), the fourth photoresist layer 32 is removed.

In FIG. 2V, as recited in the step (S121), a portion of the third plating layer 31 that is uncovered by the second circuit 33 is removed, and the second circuit 33 and a portion of the third plating layer 31 that is covered by the second circuit 33 are maintained. A portion of the second substrate 30 is uncovered by the second circuit 33 and the third plating layer 31.

When the first to fourth photoresist layers 12, 20, 22, 32 are patterned, the first to fourth photoresist layers 12, 20, 22, 32 are processed by exposure and development to form the first to fourth photoresist layers 12, 20, 22, 32 having specific patterns.

When the first to fourth photoresist layers 12, 20, 22, 32 are removed, the first to fourth photoresist layers 12, 20, 22, 32 are removed by stripper.

When the first to third plating layers 11, 21, 31 are removed, the first to third plating layers 11, 21, 31 are removed by etchant.

In the embodiment, the first to fourth photoresist layers 12, 20, 22, 32 are dry films.

In the present invention, the second photoresist layer 20 is patterned to form the at least one via 201, and the at least one connecting pillar 202 is formed by plating the second plating layer 21 to fill the at least one via 201 before the second substrate 30 is formed. Therefore, when the second circuit 33 is formed, the fourth photoresist layer 32 may not need to be patterned to match the at least one via 201, and the second circuit 33 may be directly electronically connected to the at least one connecting pillar 202 to connect to the first circuit 13.

Besides, the second substrate 30 is formed after the at least one connecting pillar 202 is formed, and the at least one top of the at least one connecting pillar 202 is exposed out of the surface of the second substrate 30. When the second circuit 33 is formed by plating the third plating layer 31, the at least one via 201 does not need to be filled, and the second circuit 33 is formed on the at least one top of the at least one connecting pillar 202 and the surface of the second substrate 30. Then, a top surface of the second circuit 33 may be flat. Therefore, when a circuit board is welded at the second circuit 33, the circuit board may be well welded at the second circuit 33 because of an even surface, and the circuit board may be firmly welded at the second circuit 33.

In the embodiment, an area of the patterned third photoresist layer 22 that covers the at least one via 201 is greater than a section area of the at least one via 201. When the exposed and plated second plating layer 21 is removed, the unexposed second plating layer 21 is connected to the at least one connecting pillar 202, and an area of the unexposed second plating layer 21 that is not removed is greater than a section area of the at least one connecting pillar 202. Therefore, an area of the at least one connecting pillar 202 exposed out of the surface of the second substrate 30 is greater than an area of the at least connecting pillar 202 connected to the first circuit 13. When the second circuit 33 is formed, the second circuit 33 has a greater connecting area to connect the at least one connecting pillar 202, and the second circuit 33 may connect to the first circuit 13 through the at least one connecting pillar 202 with the greater connecting area.

In conclusion, the at least one via 201 is fully filled to form the at least one connecting pillar 202, and the connecting area between the second circuit 33 and the at least one connecting pillar 202 is increased. Therefore, connection strength between the first circuit 13 and the second circuit 33 may be raised. Further, a yield rate of the landless multilayer circuit board may be raised.

Figure 3:
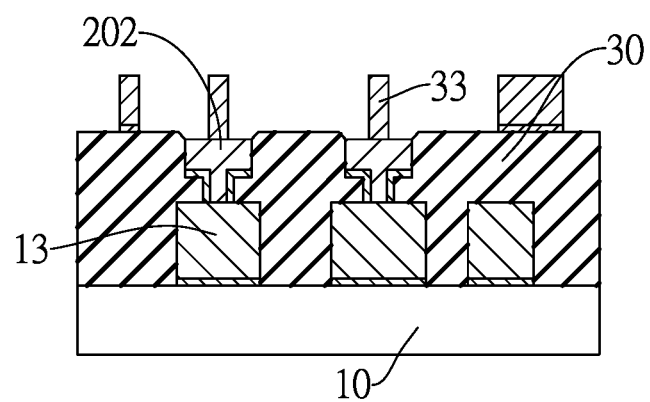
FIG. 3 is a sectional view of an embodiment of a landless multilayer circuit board.
Figures 4A, 4B, 4C, 4D, 4E:
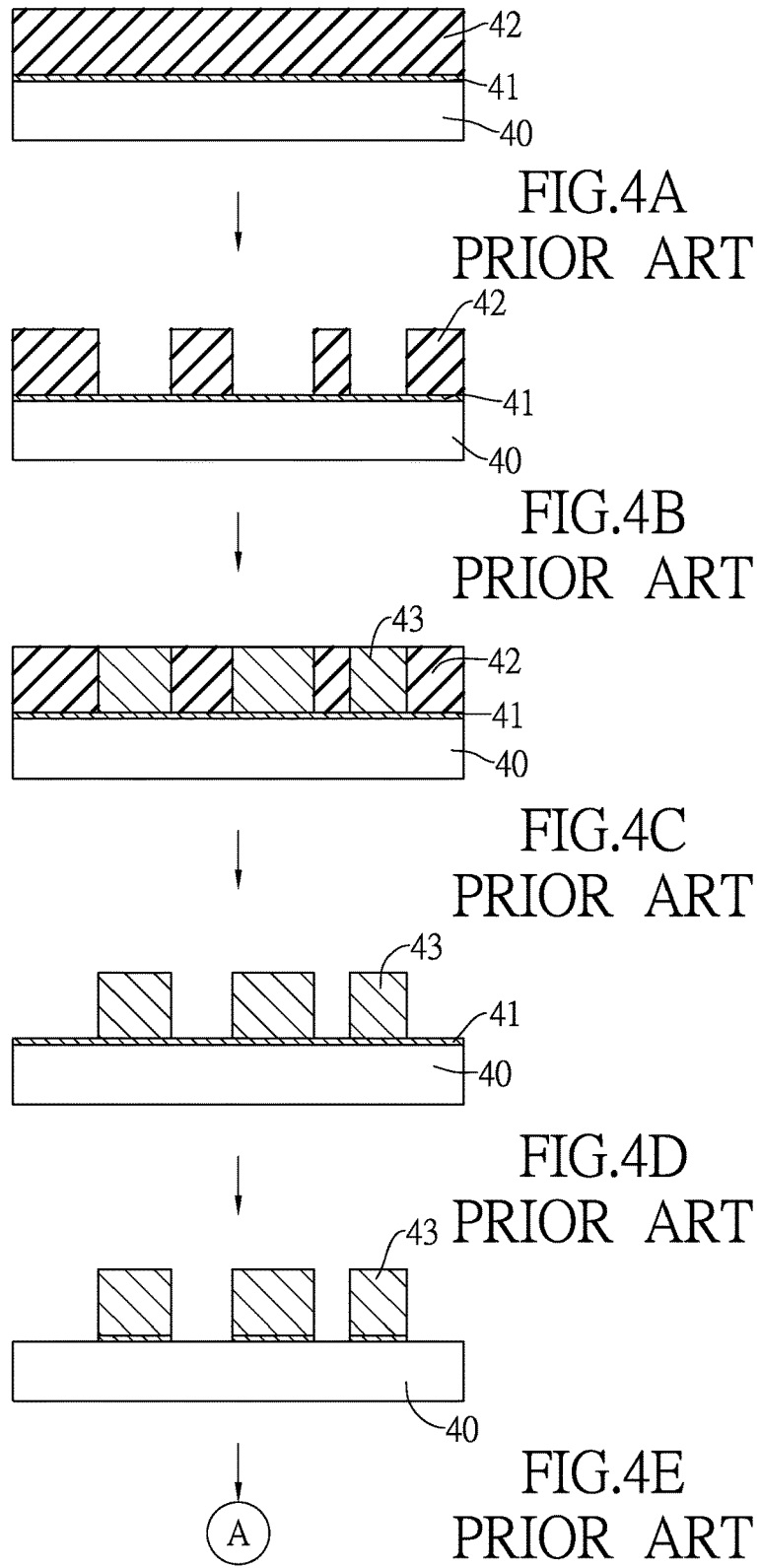
Figure 4J:
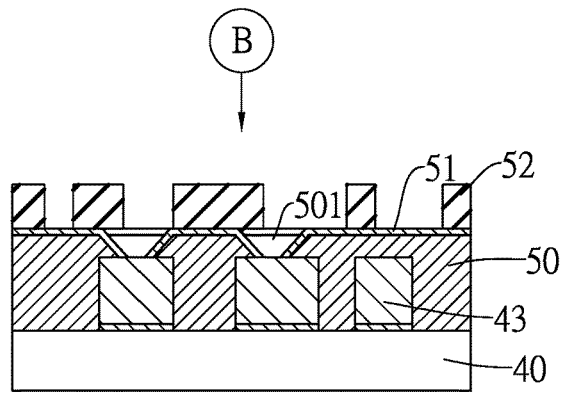
Figure 4K:
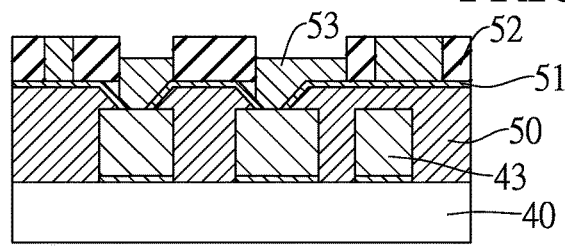
Figure 4L:
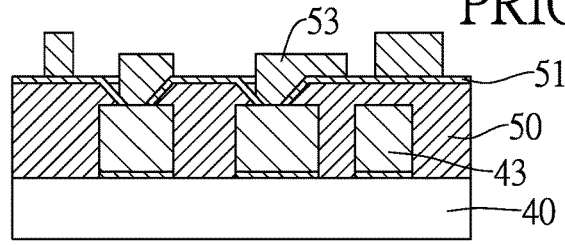
Figure 4M:
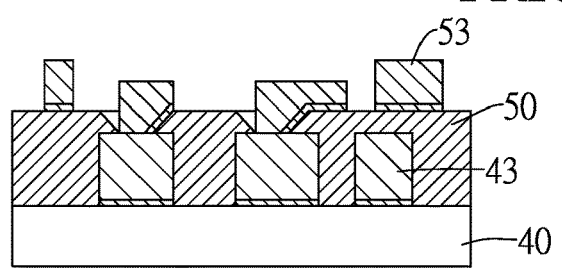
Figure 5:
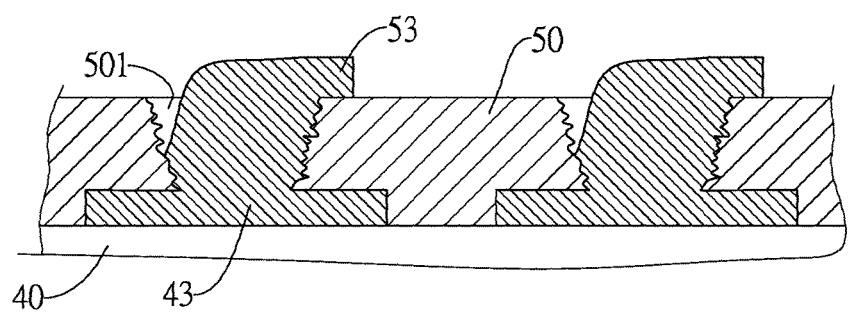
FIG. 5 is a sectional view of a conventional multilayer circuit board having a gap at an edge of at least one via of the conventional multilayer circuit board.
Figure 6:
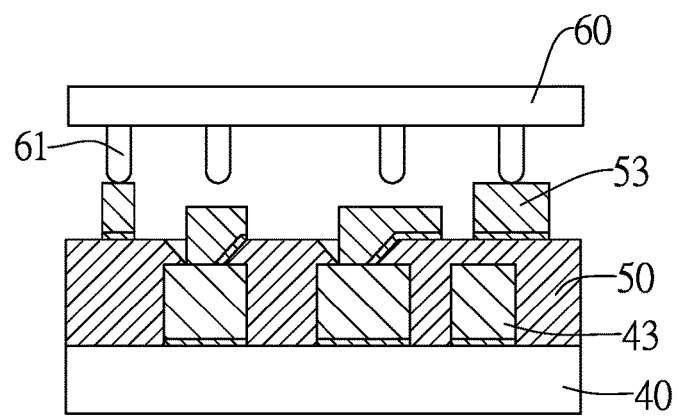
FIG. 6 is a schematic view of connecting a circuit board with a conventional multilayer circuit board.

With reference to FIG. 3, the landless multilayer circuit board of the present invention comprises a first substrate 10, a first circuit 13, at least one connecting pillar 202, a second substrate 30, and a second circuit 33.

The first circuit 13 is mounted on a surface of the first substrate 10. The at least one connecting pillar 202 is connected to the first circuit 13. The second substrate 30 is mounted on the surface of the first substrate 10 and covers the first circuit 13 and the at least one connecting pillar 202. At least one top of the at least one connecting pillar 202 is exposed out of a surface of the second substrate 30, and an area of a portion of the at least one connecting pillar 202 that is exposed out of the surface of the second substrate 30 is greater than an area of a portion of the at least one connecting pillar 202 that is connected to the first circuit 13. The second circuit 33 is mounted on the surface of the second substrate 30 and the at least one connecting pillar 202, and is connected to the portion of the at least one connecting pillar 202 that is exposed out of the surface of the second substrate 30.

The at least one top of the at least one connecting pillar 202 is exposed out of the surface of the second substrate 30, and the portion of the at least one connecting pillar 202 that is exposed out of the surface of the second substrate 30 is at a same plane with the surface of the second substrate 30. Therefore, the second circuit 33 may be flatly formed. When a circuit board is welded at the second circuit 33, the circuit board may be firmly welded at the second circuit 33.

Further, since the area of the portion of the at least one connecting pillar 202 that is exposed out of the surface of the second substrate 30 is greater than the area of the at least one connecting pillar 202 connected to the first circuit 13, the second circuit 33 may be firmly connected to the at least one connecting pillar 202, and be firmly connected to the first circuit 13 through the firmly connected at least one connecting pillar 202. Therefore, a yield rate of the landless multilayer circuit board may be raised.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A manufacturing method of a landless multilayer circuit board, comprising steps of:

providing a first substrate; wherein a first plating layer is mounted on the first substrate and a first photoresist layer is mounted on the first plating layer;

patterning the first photoresist layer to form a groove of a first circuit pattern in the first photoresist layer, wherein the first plating layer is exposed in the groove of the first circuit pattern;

forming a first circuit in the groove of the first circuit pattern on the first plating layer by plating the first plating layer to fill the groove of the first circuit pattern;

removing the first photoresist layer to expose the first plating layer, and maintaining the first circuit; wherein a portion of the first plating layer is uncovered by the first circuit;

removing a portion of the first plating layer that is uncovered by the first circuit, and maintaining the first circuit and a portion of the first plating layer that is covered by the first circuit; wherein a portion of the first substrate is uncovered by the first circuit and the first plating layer;

forming a second photoresist layer on the first substrate to cover the first circuit and the portion of the first plating layer that is covered by the first circuit;

patterning the second photoresist layer to form at least one via to expose a top surface of the first circuit;

forming a second plating layer on a surface of the second photoresist layer and in the at least one via; wherein the second plating layer is electrically connected to the first circuit;

forming at least one connecting pillar that fills the at least one via by plating the second plating layer in the at least one via;

forming a third photoresist layer on the at least one connecting pillar and the plated second plating layer;

patterning the third photoresist layer to cover at least one top of the at least one connecting pillar and to expose the plated second plating layer;

removing a portion of the second plating layer that is uncovered by the third photoresist layer;

removing the third photoresist layer;

removing the second photoresist layer;

forming a second substrate on the first substrate to cover the first circuit and the at least one connecting pillar;

drilling the second substrate by laser to expose the at least one top of the at least one connecting pillar out of a surface of the second substrate;

forming a third plating layer on the surface of the second substrate; wherein the third plating layer is electronically connected to the at least one connecting pillar;

forming a fourth photoresist layer on a surface of the third plating layer;

patterning the fourth photoresist layer to form a groove of a second circuit pattern in the second photoresist layer, wherein the third plating layer is exposed in the groove of the second circuit pattern;

forming a second circuit in the groove of the second circuit pattern on the third plating layer by plating the third plating layer;

removing the fourth photoresist layer to expose the third plating layer, and maintaining the second circuit; wherein a portion of the third plating layer is uncovered by the second circuit;

removing a portion of the exposed third plating layer that is uncovered by the second circuit, the second circuit and a portion of the third plating layer that is covered by the second circuit are maintained; wherein a portion of the second substrate is uncovered by the second circuit and the third plating layer.

2. The manufacturing method of a landless multilayer circuit board as claimed in claim 1, wherein an area of a portion of the at least one connecting pillar that is out of the surface of the second substrate is greater than an area of a portion of the at least one connecting pillar that is connected to the first circuit.

3. The manufacturing method of a landless multilayer circuit board as claimed in claim 2, wherein when the first to fourth photoresist layers are patterned, the first to fourth photoresist layers are processed by exposure and development to form the first to fourth photoresist layers having specific patterns.

4. The manufacturing method of a landless multilayer circuit board as claimed in claim 2, wherein when the first to fourth photoresist layers are removed, the first to fourth photoresist layers are removed by stripper.

5. The manufacturing method of a landless multilayer circuit board as claimed in claim 2, wherein when the first to third plating layers are removed, the first to third plating layers are removed by etchant.

6. The manufacturing method of a landless multilayer circuit board as claimed in claim 2, wherein the first to fourth photoresist layers are dry films.

7. The manufacturing method of a landless multilayer circuit board as claimed in claim 1, wherein when the first to fourth photoresist layers are patterned, the first to fourth photoresist layers are processed by exposure and development to form the first to fourth photoresist layers having specific patterns.

8. The manufacturing method of a landless multilayer circuit board as claimed in claim 1, wherein when the first to fourth photoresist layers are removed, the first to fourth photoresist layers are removed by stripper.

9. The manufacturing method of a landless multilayer circuit board as claimed in claim 1, wherein when the first to third plating layers are removed, the first to third plating layers are removed by etchant.

10. The manufacturing method of a landless multilayer circuit board as claimed in claim 1, wherein the first to fourth photoresist layers are dry films.

* * * * *